(12) United States Patent
Wei et al.

(10) Patent No.: US 11,513,617 B2
(45) Date of Patent: Nov. 29, 2022

(54) DISPLAY DEVICE WITH A CONTROL CIRCUIT BOARD

(71) Applicant: BOE TECHNOLOGY GROUP CO., LTD., Beijing (CN)

(72) Inventors: Jinggang Wei, Beijing (CN); Lei Cao, Beijing (CN); Long Yang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 188 days.

(21) Appl. No.: 16/769,565

(22) PCT Filed: Sep. 24, 2019

(86) PCT No.: PCT/CN2019/107564
§ 371 (c)(1),
(2) Date: Jun. 3, 2020

(87) PCT Pub. No.: WO2020/093803
PCT Pub. Date: May 14, 2020

(65) Prior Publication Data
US 2021/0157418 A1 May 27, 2021

(30) Foreign Application Priority Data

Nov. 5, 2018 (CN) .......................... 201821816883.3

(51) Int. Cl.
*G06F 3/0362* (2013.01)
*G06F 3/038* (2013.01)
(Continued)

(52) U.S. Cl.
CPC .......... *G06F 3/0362* (2013.01); *G06F 3/0383* (2013.01); *H01H 3/08* (2013.01);
(Continued)

(58) Field of Classification Search
None
See application file for complete search history.

(56) References Cited

U.S. PATENT DOCUMENTS 5,311,666 A * 5/1994 Jacobsen .............. G01D 5/2415
33/1 PT
9,952,558 B2 4/2018 Ely
(Continued)

FOREIGN PATENT DOCUMENTS

CN 201153080 Y 11/2008
CN 105962791 A 9/2016
(Continued)

*Primary Examiner* — Chad M Dicke
(74) *Attorney, Agent, or Firm* — McDermott Will & Emery LLP (57) ABSTRACT

Embodiments of the present disclosure provide a display device. The display device includes: a display panel; a control circuit board; and a rotary knob assembly connected to the control circuit board. The rotary knob assembly includes a rotary rod and a rotary knob cap, the rotary rod is connected to the rotary knob cap, and the rotary knob cap is configured to drive the rotary rod to rotate. The display panel is connected to the control circuit board, the rotary knob assembly is configured for generating a signal according to an action of the rotary knob cap and transmitting the signal to the control circuit board, and the control circuit board is configured for controlling the display panel to display according to the signal.

16 Claims, 5 Drawing Sheets

(51) Int. Cl.
*G09G 3/20* (2006.01)
*H01H 3/08* (2006.01)
*H01H 3/12* (2006.01)
*H01H 9/02* (2006.01)
*H01H 19/04* (2006.01)
*H01H 19/14* (2006.01)
*H05K 5/00* (2006.01)
*H05K 5/02* (2006.01)

(52) U.S. Cl.
CPC ............... *H01H 3/12* (2013.01); *H01H 9/02* (2013.01); *H01H 19/04* (2013.01); *H01H 19/14* (2013.01); *H05K 5/0017* (2013.01); *G09G 3/20* (2013.01); *G09G 2354/00* (2013.01); *G09G 2380/16* (2013.01); *H01H 2221/01* (2013.01); *H01H 2231/016* (2013.01); *H05K 5/0286* (2013.01)

(56) References Cited

U.S. PATENT DOCUMENTS

| | | | |
|---|---|---|---|
| 10,037,006 B2 | 7/2018 | Ely | |
| 2002/0054017 A1* | 5/2002 | Agata | G06F 1/169 |
| | | | 345/157 |
| 2005/0012758 A1* | 1/2005 | Christou | G09G 3/20 |
| | | | 345/619 |
| 2006/0071672 A1* | 4/2006 | Tola | G01D 5/2415 |
| | | | 324/662 |
| 2008/0289940 A1* | 11/2008 | Kim | H01H 19/025 |
| | | | 200/336 |
| 2016/0259301 A1 | 9/2016 | Ely | |
| 2017/0003655 A1 | 1/2017 | Ely | |
| 2018/0239306 A1 | 8/2018 | Ely | |
| 2018/0364817 A1* | 12/2018 | Ota | G06F 3/016 |
| 2020/0122575 A1* | 4/2020 | Chion | B60K 35/00 |

FOREIGN PATENT DOCUMENTS

| | | |
|---|---|---|
| CN | 205750744 U | 11/2016 |
| CN | 106229198 A | 12/2016 |
| CN | 205943891 U | 2/2017 |
| CN | 206696741 U | 12/2017 |
| CN | 208889254 U | 5/2019 |
| EP | 0780754 A1 | 6/1997 |
| JP | 2015165486 A | 9/2015 |

* cited by examiner

DISPLAY DEVICE WITH A CONTROL CIRCUIT BOARD

CROSS-REFERENCE TO RELATED APPLICATION

This application is a Section 371 National Stage Application of International Application No. PCT/CN2019/107564, filed on Sep. 24, 2019 and entitled with "DISPLAY DEVICE", and claims priority to Chinese Application No. 201821816883.3, filed on Nov. 5, 2018, the contents of which are incorporated herein by reference in their entirety.

TECHNICAL FIELD

Embodiments of the present disclosure relate to the field of display technology, and in particular, to a display device.

BACKGROUND

The display device is a flat panel display device dedicated to displaying images, generally a liquid crystal display (LCD).

In the related art, in order to achieve diversity of images displayed by the display device, the display device may be made in a communication connection with a remote control. The user can switch the images displayed in the display device by the remote control.

SUMMARY

According to an embodiment of the present disclosure, there is provided a display device, comprising:
a display panel;
a control circuit board connected to the display panel; and
a rotary knob assembly connected to the control circuit board,
wherein the rotary knob assembly comprises a rotary rod and a rotary knob cap, the rotary rod is connected to the rotary knob cap, and the rotary knob cap is configured to drive the rotary rod to rotate;
wherein the rotary knob assembly is configured for generating a signal according to an action of the rotary knob cap and transmitting the signal to the control circuit board, and the control circuit board is configured for controlling the display panel to display according to the signal.

According to some embodiments of the present disclosure, the rotary knob assembly further comprises a switch encoder, the rotary rod is rotatably connected to the switch encoder, the switch encoder is further connected to the control circuit board, and the signal is generated by a movement of the rotary rod relative to the switch encoder.

According to some embodiments of the present disclosure, the display device further comprises a casing, the rotary knob cap is disposed outside the casing, and a gap is provided between the rotary knob cap and the casing.

According to some embodiments of the present disclosure, the casing is a rear case of the display device, and the rear case is located at a side of the display device opposite to a display surface of the display panel.

According to some embodiments of the present disclosure, the rotary knob assembly further comprises an elastic connecting member configured to sleeve the rotary rod and located between the casing and the rotary knob cap; or wherein the rotary knob assembly further comprises an elastic connecting member, the switch encoder comprises a groove, the elastic connecting member is disposed in the groove of the switch encoder, and one end of the rotary rod away from the rotary knob cap is disposed in the groove of the switch encoder, and the elastic connecting member is located between the rotary rod and an inner wall of the groove of the switch encoder.

According to some embodiments of the present disclosure, the rotary knob cap comprises a rotary knob cap body and a connection sleeve, the rotary knob cap body comprises a cover plate and a baffle plate surrounding the cover plate, and the baffle plate is located at a side of the cover plate adjacent to the casing;

wherein the connection sleeve is disposed at the side of the cover plate adjacent to the casing, and one end of the rotary rod is disposed in the connection sleeve and fixedly connected to the connection sleeve.

According to some embodiments of the present disclosure, the rotary knob assembly further comprises a shielding sleeve;

wherein the shielding sleeve is disposed at the side of the cover plate adjacent to the casing, the connection sleeve is located in the shielding sleeve, one end of the shielding sleeve is configured to protrude from the baffle plate of the rotary knob cap body and distanced from the casing by a gap.

According to some embodiments of the present disclosure, the connection sleeve, the rotary rod and the rotary knob cap body are coaxial; and
the connection sleeve is in interference fit with the rotary rod.

According to some embodiments of the present disclosure, the shielding sleeve, the connection sleeve and the rotary knob cap body are of an integrated structure.

According to some embodiments of the present disclosure, the switch encoder and the control circuit board are both disposed in the casing; and
the casing is provided with a through hole, one end of the rotary rod is connected to the rotary knob cap, and the other end of the rotary rod is rotatably connected to the switch encoder through the through hole.

According to some embodiments of the present disclosure, an annular boss is provided outside the casing, the through hole is located in a region defined by the annular boss, and a gap is provided between the rotary knob cap and the annular boss.

According to some embodiments of the present disclosure, an outer diameter of the annular boss is equal to an outer diameter of an end of the rotary knob cap adjacent to the annular boss.

According to some embodiments of the present disclosure, a recess is provided in the cover plate of the rotary knob cap body at a side of the cover plate away from the casing and recessed in a direction from a surface of the cover plate to the casing, an axis of the recess of the cover plate is parallel to an axis of the rotary knob cap body, and is not collinear with the axis of the rotary knob cap body.

According to some embodiments of the present disclosure, the rotary knob cap further comprises a protrusion provided at a side of the cover plate adjacent to the casing and located in the connection sleeve;
a groove is provided in an end of the rotary rod, and the protrusion is seized in the groove of the rotary rod.

According to some embodiments of the present disclosure, the display device is an electronic picture frame.

According to some embodiments of the present disclosure, the switch encoder is provided with a plurality of stationary contacts distributed circumferentially with the rotary rod as an axis, and a movable contact is provided on the rotary rod.

According to some embodiments of the present disclosure, a length of a portion of the shielding sleeve protruding from the rotary knob cap body is greater than a distance between the baffle plate and the annular boss.

According to some embodiments of the present disclosure, a support hole, a charging hole, and a card slot are provided in the rear case, the support hole is configured to connect with a support rod to support the display device, the charging hole is configured to connect with a power supply, and the card slot is configured to receive a memory card.

According to some embodiments of the present disclosure, the rotary knob assembly is configured to perform a rotation operation for switching displayed pictures or videos and a pressing operation for locking the displayed pictures or videos.

According to some embodiments of the present disclosure, the switch encoder comprises a groove, a plurality of first stationary contacts and a plurality of second stationary contacts are provided in the groove of the switch encoder, the plurality of first stationary contacts are distributed circumferentially with the rotary rod as an axis, and the plurality of second stationary contacts are distributed circumferentially with the rotary rod as an axis, a first movable contact and a second movable contact are provided on an end of the rotary rod located in the groove of the switch encoder, the first movable contact is configured to contact with the plurality of first stationary contacts rotatably, and the second movable contact is configured to contact with the plurality of second stationary contacts rotatably.

BRIEF DESCRIPTION OF THE DRAWINGS

In order to more clearly illustrate the technical solutions in the embodiments of the present disclosure, the accompanying drawings necessary for the description of the embodiments will be briefly introduced below. Obviously, the drawings in the following description only represent some embodiments of the present disclosure. Other drawings may be obtained by those skilled in the art based on these drawings without creative effort.

DETAILED DESCRIPTION OF EMBODIMENTS

In order to make the objectives, technical solutions, and advantages of the present disclosure much clearer, the embodiments of the present disclosure will be described in further detail below with reference to the accompanying drawings.

Generally, when a remote control is used to control a painted screen display device, the cost is high and the flexibility is low. The embodiments of the present disclosure provide a display device, which can solve the problems of high cost and low flexibility when the remote control controls the painted screen display device in the related art.

Figure 1:
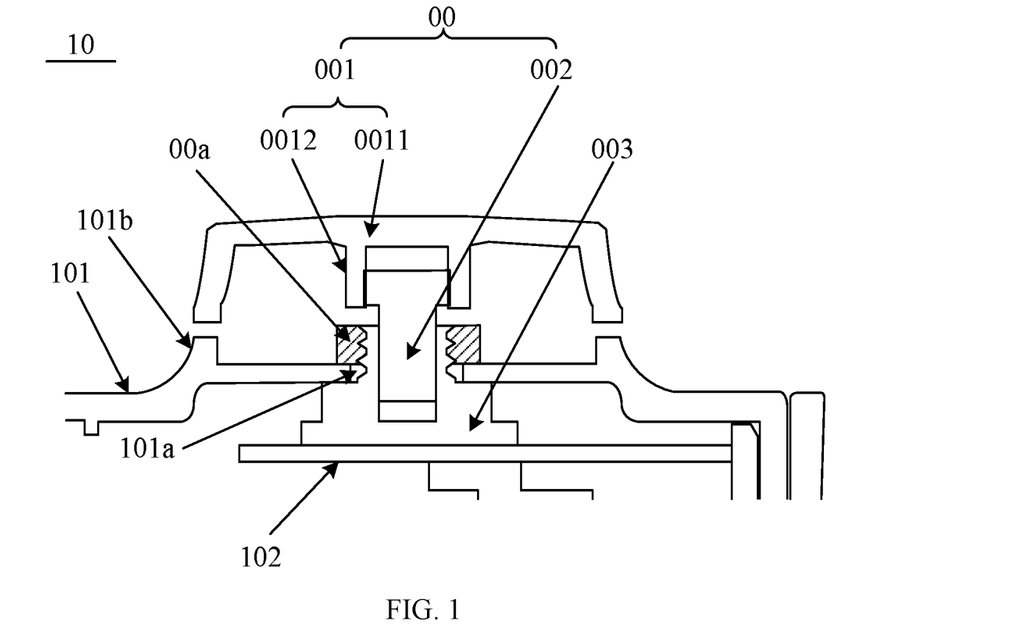
FIG. 1 is a schematic partial structural view of a display device according to an embodiment of the present disclosure.

FIG. 1 is a schematic partial structural view of a display device according to an embodiment of the present disclosure. As may be seen with reference to FIG. 1, the display device 10 may include a rear case 101, a control circuit board 102, and a rotary knob assembly 00 connected to the control circuit board 102. The rotary knob assembly 00 may include a rotary knob cap 001 and a rotary rod 002 connected to the rotary knob cap 001. The rotary knob cap 001 may be disposed on an outer surface of the rear case 101, and there may be a gap between the rotary knob cap 001 and the outer surface. The outer surface is a surface opposite to a display surface of the display device 10. The rotary knob cap 001 may be configured to drive the rotary rod 002 to rotate, and the connection between the rotary knob cap 001 and the rotary rod 002 may be a detachable fixed connection. It should be noted that the rotary knob assembly 00 and components included therein in the present disclosure may be disposed at other positions of the display device, for example, disposed on a side surface or even a front face of the display device.

When the user rotates the rotary knob cap 001, the rotation of the rotary knob cap 001 may be detected by the rotary knob assembly 00, and a first control signal may be transmitted to the control circuit board 102 connected to the rotary knob assembly 00. The control circuit board 102 may thus control the display device 10 according to the first control signal. For example, the images displayed by the display device 10 may be switched according to the first control signal.

In summary, according to the embodiments of the present disclosure, there is provided a display device, which includes a rear case, a control circuit board, and a rotary knob assembly connected to the control circuit board. The rotary knob assembly may include a rotary knob cap and a rotary rod connected to the rotary knob cap. The rotary knob cap may be disposed on an outer surface of the rear case. Since the region outside the rear case of the display device is large, the size of the rotary knob cap disposed on the outside of the rear case may be designed to be large, it is not only beautiful, but also easy to operate, meeting ergonomic principles. In addition, the cost of switching images through the rotary knob assembly is lower but the flexibility of the switching is higher.

In the embodiments of the present disclosure, the display device 10 may further include a display module that may be fixed in the rear case 101. When the user views the picture displayed on the display surface of the display device 10, the rotary knob cap 001 cannot be seen, which ensures the overall aesthetics of the display device 10.

There is a gap between the rear case 101 and the display module, and the gap may be configured for arranging a driving assembly and a control assembly of the display module, for example, the control circuit board 102. The display module may be connected to the control circuit board 102. The rotary knob assembly 00 may be used to control the control circuit board 102 to control the contents displayed by the display module by turning the rotary knob cap 001.

According to some embodiments of the present disclosure, the display module may be a liquid crystal display module or an organic light emitting diode (OLED) display module. The liquid crystal display module may include a liquid crystal display screen and a backlight module. The OLED display module may include OLEDs.

Exemplarily, the display device 10 may be an electronic picture frame, for example, it may be a painted screen display device. That is, the display device 10 may be a flat panel display device dedicated to displaying an image, such as a photograph or a painting.

Figure 2:
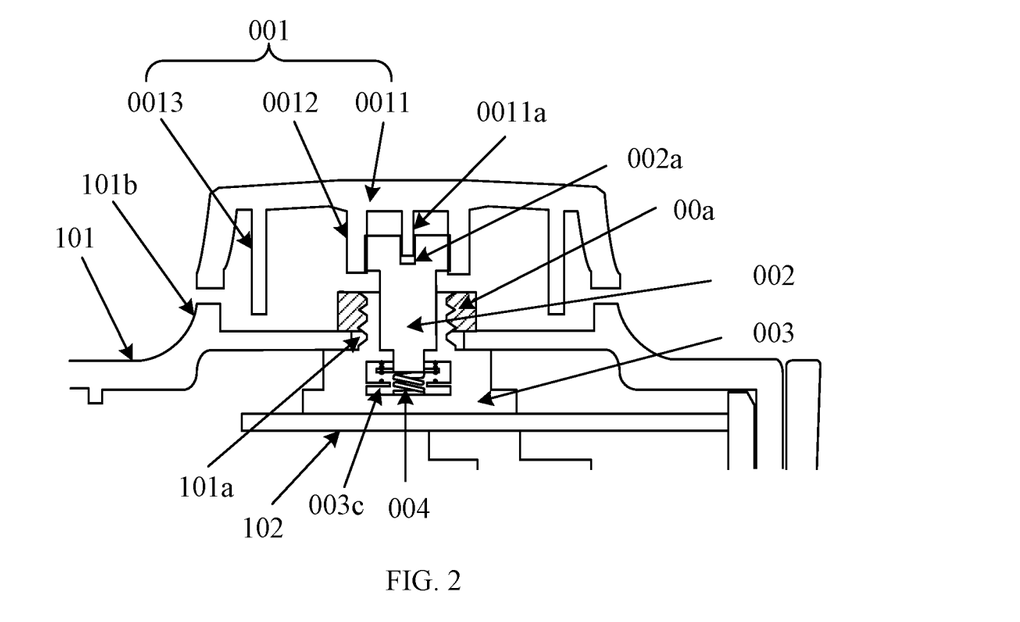
FIG. 2 is a schematic partial structural view of a display device according to an embodiment of the present disclosure.

FIG. 2 is a schematic partial structural view of a display device according to an embodiment of the present disclosure. As may be seen with reference to FIG. 1 and FIG. 2, the rotary knob assembly 00 may further include a switch encoder 003. One end of the rotary rod 002 may be fixedly connected with the rotary knob cap 001, and the other end of the rotary rod is rotatably connected with the switch encoder 003. That is, the rotary rod 002 may be rotated relative to the switch encoder 003. The switch encoder 003 is also connected to the control circuit board 102. For example, the switch encoder 003 and the control circuit board 102 may be connected to each other by welding. Herein, the rotatable connection means that the rotary rod and the switch encoder may remain connected while the two are rotated relative to each other.

Exemplarily, referring to FIG. 2, the switch encoder 003 may be provided with a groove 003*c*, the other end of the rotary rod 002 may be located in the groove 003*c*, and the rotary rod 002 may rotate in the groove 003*c*.

Figure 3:
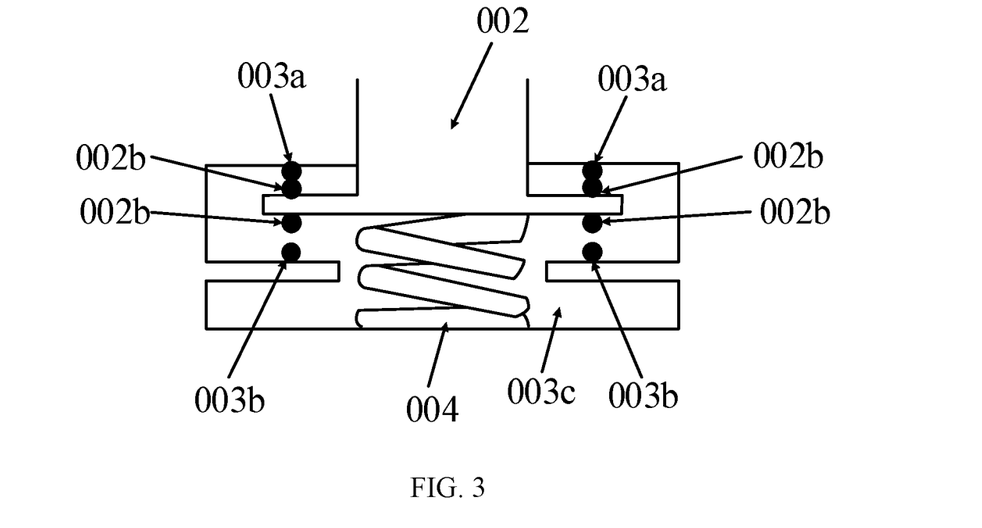
FIG. 3 is a partially enlarged structural view of the display device shown in FIG. 2.

FIG. 3 is a partially enlarged structural view of the display device shown in FIG. 2. As may be seen with reference to FIG. 3, a plurality of first stationary contacts 003*a* may be provided in the groove 003*c* of the switch encoder 003, and the plurality of first stationary contacts 003*a* may be distributed circumferentially with the rotary rod 002 as an axis. The other end of the rotary rod 002 may be provided with movable contacts 002*b*. When the user rotates the rotary knob cap 001, the rotary rod 002 will rotate in the switch encoder 003, so that the movable contacts 002*b* contact different first stationary contacts 003*a* in the switch encoder 003 to form a connection path. The switch encoder 003 may then transmit a first control signal to the control circuit board 102. The control circuit board 102 may control the display device 10 according to the first control signal.

Figure 4:
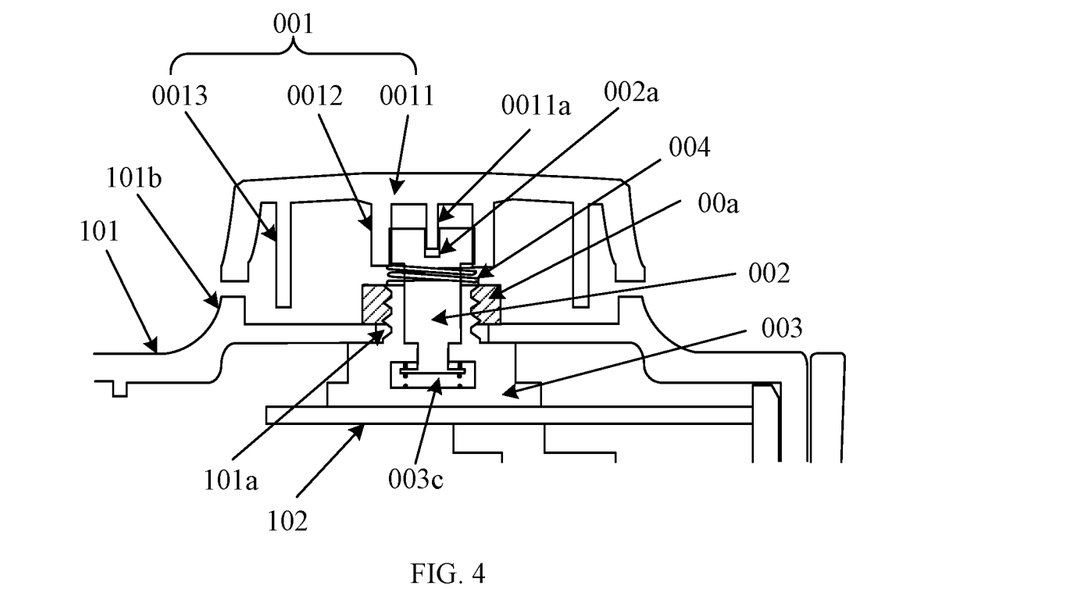
FIG. 4 is a schematic partial structural view of a display device according to an embodiment of the present disclosure.

FIG. 4 is a schematic partial structural view of a display device according to an embodiment of the present disclosure. As may be seen with reference to FIGS. 2 to 4, the rotary knob assembly may further include an elastic connecting member 004.

As a possible implementation manner, referring to FIG. 4, the elastic connecting member 004 may be configured to sleeve the rotary rod 002 and located between the rear case 101 and the rotary knob cap 001. One end of the elastic connecting member 004 may be fixedly connected to the rear case 101, and the other end is not fixedly connected to the rotary rod 002. Alternatively, one end of the elastic connecting member 004 is not fixedly connected to the rear case 101, and the other end is fixedly connected to the rotary rod 002. Alternatively again, the elastic connecting member 004 is not fixedly connected to both the rear case 101 and the rotary rod 002. The elastic connecting member 004 may be a spring.

When the user rotates the rotary knob cap 001, the elastic connecting member 004 may be kept still, and the rotary rod 002 may be rotated in the elastic connecting member 004. Alternatively, the elastic connecting member 004 may rotate together with the rotary rod 002. The embodiments of the present disclosure are not limited thereto.

As another possible implementation manner, it may be seen with reference to FIGS. 2 and 3 that the other end of the rotary rod 002 and the elastic connecting member 004 may both be located in the groove 003*c*, and the other end of the rotary rod 002 is located at a side of the elastic connecting member 004 away from the bottom of the groove 003*c*, that is, the elastic connecting member 004 is disposed between the other end of the rotary rod 002 and the bottom of the groove 003*c*. The rotary rod 002 may rotate in the groove 003*c*. The one end of the elastic connecting member 004 may be fixedly connected to the other end of the rotary rod 002, and the other end of the elastic connecting member is not fixedly connected to the bottom of the groove 003*c* of the switch encoder. Alternatively, the one end of the elastic connecting member 004 may not be fixedly connected to the other end of the rotary rod 002, and the other end of the elastic connecting member is fixedly connected to the bottom of the groove 003*c* of the switch encoder. Alternatively again, the elastic connecting member 004 is not fixedly connected to both the bottom of the groove 003*c* and the rotary rod 002.

When the user rotates the rotary knob cap 001, the elastic connecting member 004 may be kept still, and the rotary rod 002 may be rotated in the switch encoder 004. Alternatively, the elastic connecting member 004 may rotate together with the rotary rod 002. The embodiments of the present disclosure are not limited thereto.

Referring to FIG. 3, second stationary contacts 003*b* may be further provided in the switch encoder 003. When the user presses the rotary knob cap 001, the rotary rod 002 may compress the elastic connecting member 004, and the movable contacts 002*b* at the other end of the rotary rod 002 may contact the second stationary contacts 003*b* in the switch encoder 003 to form a connection path. The switch encoder 003 may then transmit a second control signal to the control circuit board 102, and the control circuit board 102 may control the display device 10 according to the second control signal. As shown in FIG. 3, the groove 003*c* may be configured to include a top wall, a bottom wall, and a side wall. The top wall has an opening, and the rotary rod 002 extends from the opening. Further, an annular plate that is parallel to the bottom wall is provided on the side wall of the groove 003*c*; the other end of the rotary rod 002 is configured to include an extending plate extending from the body of the rotary rod to the outer periphery. The first stationary contacts 003*a* may be multiple, they are located at the same vertical height, disposed on the lower surface of the top wall, and distributed uniformly circumferentially with the rotary rod 002 as an axis. The number of the second stationary contacts 003*b* may be one or multiple, multiple second stationary contacts are located at the same vertical height, disposed on the upper surface of the annular plate, and distributed uniformly circumferentially with the rotary rod 002 as an axis; the movable contacts 002*b* provided on the rotary rod 002 includes two layers of movable contacts 002*b*, which are respectively disposed on the upper and lower surfaces of the extending plate. The number of the movable contacts 002*b* in each layer may be one or multiple.

If the movable contacts in each layer are multiple, they are located at the same vertical height, and distributed uniformly circumferentially with the rotary rod 002 as an axis.

The hardware structure of the switch encoder has been described above, and the working process of the switch encoder will be described below. When the user does not press the rotary knob cap 001, the lower end of the rotary rod 002 is pressed toward the top wall of the groove 003c due to the effect of the elastic connecting member 004. At this time, the upper layer of movable contacts 002b of the rotary rod 002 contacts the first stationary contacts 003a in the groove 003c, and the lower layer of movable contacts 002b of the rotary rod 002 does not contact the second stationary contacts 003b in the groove 003c. When the user rotates the rotary knob cap 001, the rotation of the rotary knob cap 001 causes the rotary rod 002 to rotate, the contact between the upper layer of movable contacts 002b of the rotary rod 002 and the first stationary contacts 003a in the groove 003c changes, the movable contacts 002b in the upper layer sequentially contact different first stationary contacts 003a. This change in the connection path is transmitted as a first control signal to the control circuit board 102. The control circuit board 102 may control the display device 10, for example, to switch the images displayed on the display device, according to the first control signal. When the user presses the rotary knob cap 001, the rotary knob cap 001 pushes the rotary rod 002 to move, so that the upper layer of movable contacts 002b of the rotary rod 002 detaches from the first stationary contacts 003a in the groove 003c, and the lower layer of movable contacts 002b of the rotary rod 002 contacts the second stationary contacts 003b in the groove 003c, to form a connection path. This change in the connection path is transmitted to the control circuit board 102 as a second control signal. The control circuit board 102 may control the display device 10, for example, to lock the images displayed on the display device, according to the second control signal.

The control circuit board 102 may perform the same or different control operations according to the first control signal and the second control signal when controlling the display device 10. Exemplarily, the control circuit board 102 may switch the images displayed on the display device according to the first control signal, and may lock the images displayed on the display device according to the second control signal.

The rotary knob assembly 00 according to the embodiments of the present disclosure may have both rotation and pressing functions, and therefore has high flexibility in use.

Figure 5:
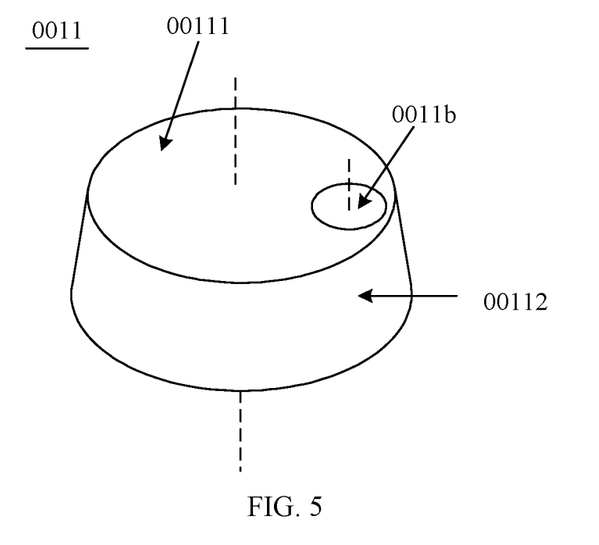
FIG. 5 is a schematic structural view of a rotary knob cap body according to an embodiment of the present disclosure.

As may be seen with reference to FIG. 1, FIG. 2 and FIG. 4, the rotary knob cap 001 may include a rotary knob cap body 0011 and a connection sleeve 0012. The rotary knob cap body 0011 and the connection sleeve 0012 may be of an integrated structure. FIG. 5 is a schematic structural view of a rotary knob cap body according to an embodiment of the present disclosure. As may be seen with reference to FIG. 5, the rotary knob cap body 0011 may include a cover plate 00111 and a baffle plate 00112 surrounding the cover plate. The cover plate 00111 and the baffle plate 00112 may be of an integrated structure. In addition, the baffle plate 00112 may be located at a side of the cover plate 00111 adjacent to the rear case 101. That is, the opening of the rotary knob cap body 0011 points to the rear case 101.

The connection sleeve 0012 may be disposed at a side of the cover plate 00111 adjacent to the rear case 101, the connection sleeve 0012 extends from the cover plate 00111 toward the rear case 101, and the one end of the rotary rod 002 may be disposed in the connection sleeve 0012 and fixedly connected with the connection sleeve 0012.

Exemplarily, the cover plate 00111 may be a circular cover plate. Correspondingly, the baffle plate 00112 may be cylindrical or cone-shaped. Of course, the cover plate 00111 may also have other shapes, such as a regular polygon, and the baffle 00112 may have a prism shape matching the shape of the cover plate 00111 accordingly.

One end of the connection sleeve 0012 provided in the rotary knob cap body 0011 may be fixedly connected to the cover plate 00111. As may be seen with reference to FIGS. 1 and 2, the connection sleeve 0012 may form a groove together with the cover plate 00111 and the one end of the rotary rod 002 may be seized in the groove.

In the embodiments of the present disclosure, the connection sleeve 0012 and the rotary rod 002 may be in interference fit with each other, so that it may further ensure that the connection sleeve 0012 and the rotary rod 002 do not rotate relative to each other, and the rotary knob assembly 00 may work normally. The interference fit between the connection sleeve 0012 and the rotary rod 002 may refer to that the assembling surface of the rotary rod 002 and the connection sleeve 0012 may generate elastic pressure by an interference value of the rotary rod 002 and the connection sleeve 0012, so that the rotary rod 002 is tightly connected with the connection sleeve 0012.

Figure 6:
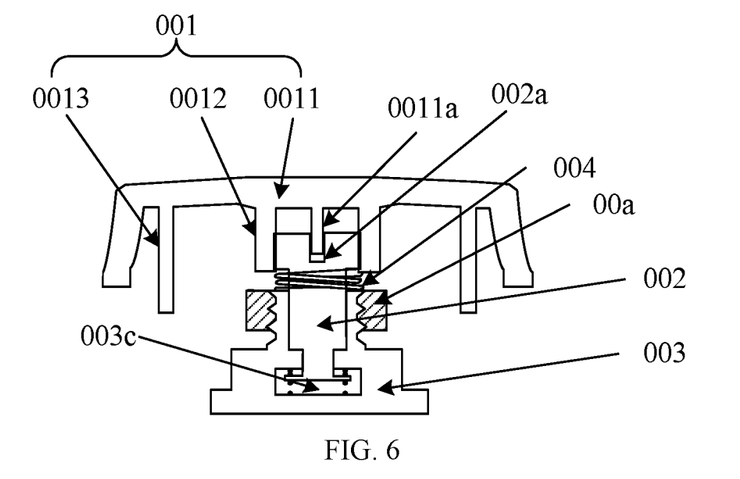
FIG. 6 is a schematic structural view of a rotary knob assembly according to an embodiment of the present disclosure.
Figure 7:
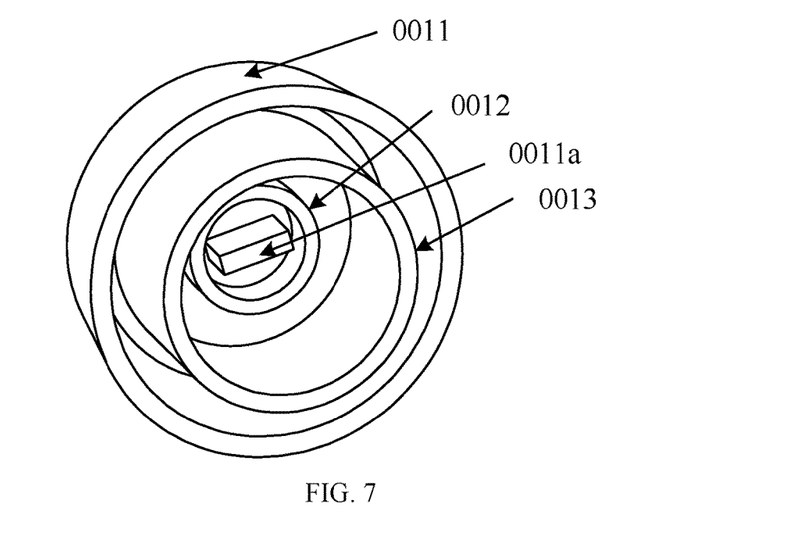
FIG. 7 is a schematic structural view of a rotary knob cap according to an embodiment of the present disclosure.

FIG. 6 is a schematic structural view of a rotary knob assembly according to an embodiment of the present disclosure. FIG. 7 is a schematic structural view of a rotary knob cap according to an embodiment of the present disclosure. As may be seen with reference to FIG. 2, FIG. 4, FIG. 6 and FIG. 7, the rotary knob assembly 00 may further include a shielding sleeve 0013.

The shielding sleeve 0013 may be disposed at a side of the cover plate 00111 adjacent to the rear case 101, the shielding sleeve 0013 extends from the cover plate 00111 toward the rear case 101, the connection sleeve 0012 may be located in the shielding sleeve 0013, and one end of the shielding sleeve 0013 may protrude from the baffle plate 00112 of the rotary knob cap body 0011, and there is a gap between the one end of the shielding sleeve and the outer surface of the rear case 101 to ensure that the rotary knob cap 001 may rotate normally. The other end of the shielding sleeve 0013 may be fixedly connected to the cover plate 00111 of the rotary knob cap body 0011.

By providing a shielding cover 0013 on the cover plate 00111 of the rotary knob cap body 0011, the shielding sleeve 0013 may shield the internal structure of the rotary knob cap 001, so that the user cannot see the internal structure of the rotary knob cap 001 from the gap between the rotary knob cap 001 and the rear case 101. In this way, it is not only beautiful, but also prevents contamination particles from entering the inside of the rotary knob cap body 0011, thereby prolonging the service life of the rotary knob assembly 00.

Referring to FIG. 2, FIG. 4, FIG. 6 and FIG. 7, it may be seen that the connection sleeve 0012, the rotary rod 002, and the rotary knob cap body 0011 may be coaxial. In addition, the shielding sleeve 0013 may also be coaxial with the rotary knob cap body 0011, thereby ensuring the structural stability of the rotary knob assembly 00, and ensuring that the user can effectively rotate the rotary knob cap body 0011.

According to some embodiments of the present disclosure, the shielding sleeve 0013, the connection sleeve 0012, and the rotary knob cap body 0011 may be of an integrated structure, thereby ensuring the structural stability of the rotary knob cap 001. Of course, the shielding sleeve 0013, the connection sleeve 0012, and the rotary knob cap body 0011 may be connected to each other by other methods, for example, the shielding sleeve 0013 and the connection sleeve 0012 may be bonded to the cover plate 00111 in the rotary knob cap body 0011, respectively.

In the embodiments of the present disclosure, as shown in FIG. 7, the connection sleeve 0012 and the shielding sleeve 0013 may both be of a cylindrical structure.

In the embodiments of the present disclosure, the rotary knob cap 001 may be made of a metal material. That is, the rotary knob cap body 0011, the connection sleeve 0012, and the shielding sleeve 0013 may all be made of a metal material. Through the use of metal material, the rotary knob cap 001 is not only beautiful and user-friendly, but also causes that it is not easy to be damaged and has a long service life.

Exemplarily, the rotary knob cap 001 may be made of die-cast zinc alloy. The process of manufacturing the rotary knob cap 001 by using the die-cast zinc alloy is relatively simple and the cost is low.

Referring to FIG. 1, FIG. 2 and FIG. 4, the switch encoder 003 and the control circuit board 102 may both be disposed inside the rear case 101. The rear case 101 may be provided with a through hole 101a. The one end of the rotary rod 002 is connected to the connection sleeve 0012 of the rotary knob cap 001 located on the outer surface of the rear case 101, and the other end thereof passes through the through hole 101a and is rotatably connected to the switch encoder 003 located in the rear case 101. Herein, the rotatable connection means that the rotary rod and the switch encoder may remain connected while they are rotated relative to each other.

In the embodiments of the present disclosure, referring to FIG. 1, FIG. 2, and FIG. 4, an annular boss 101b may be further provided on the outer surface of the rear case 101, and the through hole 101a may be located in a region defined by the annular boss 101b. There may be a gap between the rotary knob cap 001 and the annular boss, that is, the distance between the end of the baffle plate 00112 in the rotary knob cap body 0011 adjacent to the rear case 101 and the annular boss 101b may be greater than 0, so that the rotary knob assembly 00 may be effectively rotated.

According to some embodiments of the present disclosure, an outer diameter of the annular boss 101b may be equal to an outer diameter of an end of the rotary knob cap 001 adjacent to the annular boss 101b. An outer diameter of the shielding sleeve 0013 may be less than an inner diameter of the annular boss 101b, and a length of the portion of the shielding sleeve 0013 protruding from the rotary knob cap body 0011 may be greater than a distance between the baffle plate 0012 and the annular boss 101b. That is, one end of the shielding sleeve 0013 may extend into the region defined by the annular boss 101b.

In order to ensure the flexible rotation of the rotary knob cap body 0011, there is provided a gap between the annular boss 101b of the rear case 101 and the baffle 00112 in the rotary knob cap body 0011, so as to ensure that the rotary knob cap 001 may be flexibly rotated.

By providing the shielding sleeve 0013, it may prevent the user from seeing the internal structure of the rotary knob cap 001 through the gap, and it has a good aesthetic effect. In addition, the shielding sleeve 0013 may also prevent contamination particles from entering the rotary knob cap 001, thereby prolonging the service life of the rotary knob assembly 00.

Referring to FIG. 5, it may be seen that a recess 0011b recessed in a direction toward the rotary rod 002 may be provided in the outer surface the rotary knob cap body 0011, and the axis of the recess 0011b may be parallel to the axis of the rotary knob cap body 0011, but is not collinear with the axis of the rotary knob cap body 0011.

By providing a recess 0011b in the outer surface the rotary knob cap body 0011, the user may rotate the rotary knob cap body 0011 through the recess 0011b. For example, when the display device is a small-sized painted screen display device, the user may hold the painted screen display device with one hand and place a finger in the recess 0011b to rotate the rotary knob cap body 0011, thereby realizing one-hand operation of the painted screen display device and greatly facilitating the operation of the user.

According to some embodiments of the present disclosure, the recess 0011b may be disposed at an edge of the outer surface of the rotary knob cap body 0011, that is, the edge of the recess 0011b may be tangent to the edge of the rotary knob cap body 0011. This may increase the torque applied by the user to rotate the rotary knob cap body 0011 through the recess 0011b, reduce the force required to rotate the rotary knob cap body 0011, facilitating the operation of the user, and improving the user experience.

Exemplarily, referring to FIG. 5, the opening of the recess 0011b may be circular, and the inner wall of the recess 0011b may be a smooth curved surface, so that it is convenient for a user to operate.

Of course, the user may also place other joysticks (such as a stylus pen) in the recess 0011b to rotate the rotary knob cap body 0011. Alternatively, the recess 0011b may also be a mark for indicating the rotation position of the rotary knob cap, which is not limited in the embodiments of the present disclosure.

As may be seen with reference to FIG. 2, FIG. 4, FIG. 6 and FIG. 7, the rotary knob cap 001 may further include a protrusion 0011a provided in the rotary knob cap body 011 and located in the connection sleeve 0012. Correspondingly, referring to FIG. 2, FIG. 4 and FIG. 6, one end of the rotary rod 002 may be provided with a groove 002a, and the protrusion 0011a may be seized in the groove 002a.

By the engagement of the protrusion 0011a with the groove 002a, it is possible to further avoid the relative rotation of the connection sleeve 0012 in the rotary knob cap 001 and the rotary rod 002. It is not only convenient for assembly, but also ensures that the rotary rod 002 may be simultaneously rotated as the connection sleeve 0012 rotates when the rotary knob cap 001 is rotated, thereby ensuring the normal use of the rotary knob assembly 00.

Exemplarily, the protrusion 0011a in the rotary knob cap 001 may be a non-circular protrusion, for example, it may be a rectangular protrusion. Correspondingly, the one end of the rotary rod 002 may be set as having a non-circular groove 002a, for example, a rectangular groove. Of course, the protrusion 0011a and the groove 002a may also have other shapes, which are not limited in the embodiments of the present disclosure.

It may also be seen with reference to FIG. 1, FIG. 2 and FIG. 4 that the switch encoder 003 may be fixed to the rear case 101 by a nut 00a. Further, the nut 00a is provided with a through hole, and the rotary rod 002 may be connected to the switch encoder 003 by extending through the through hole in the nut 00a, thereby ensuring that the rotary knob assembly 00 does not fall off from the rear case 101, and ensuring the rotary knob assembly 00 for normal use.

In the embodiments of the present disclosure, the size of the display screen in the display module may range from 9 inches to 15 inches, the diameter of the rotary knob cap body 0011 may range from 25 millimeters (mm) to 40 mm, and may be, for example, 30 mm.

That is, the size of the display device according to the embodiments of the present disclosure may be small, so that it is convenient for the user to operate by hand, and has better comfort. Because the diameter of the rotary knob cap body 0011 is relatively large, it is convenient for the user to turn the rotary knob cap body 0011 by one hand.

It should be noted that, if the rotary knob cap body 0011 has a cylindrical structure, the diameter of the rotary knob cap body 0011 refers to the diameter of the cylindrical structure, and if the rotary knob cap body 0011 has a non-circular columnar structure (for example a polygonal prism-shaped columnar structure), the diameter of the rotary knob cap body 0011 refers to the diameter of the smallest circumscribed circle of the non-circular columnar structure.

Figure 8:
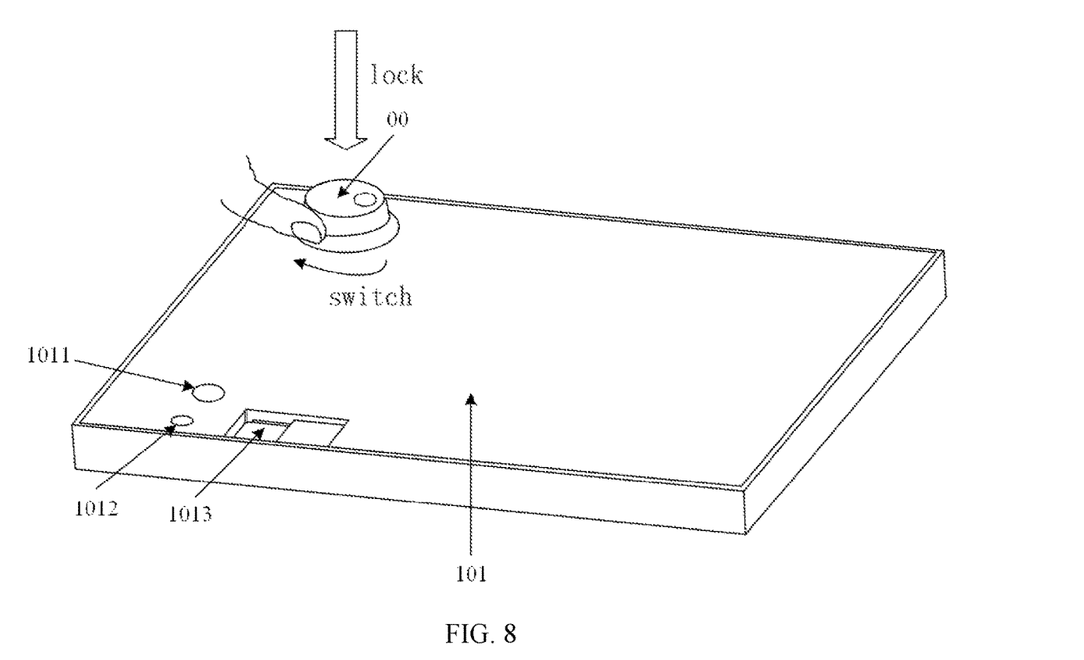
FIG. 8 is a schematic structural view of a display device according to an embodiment of the present disclosure.
Figure 9:
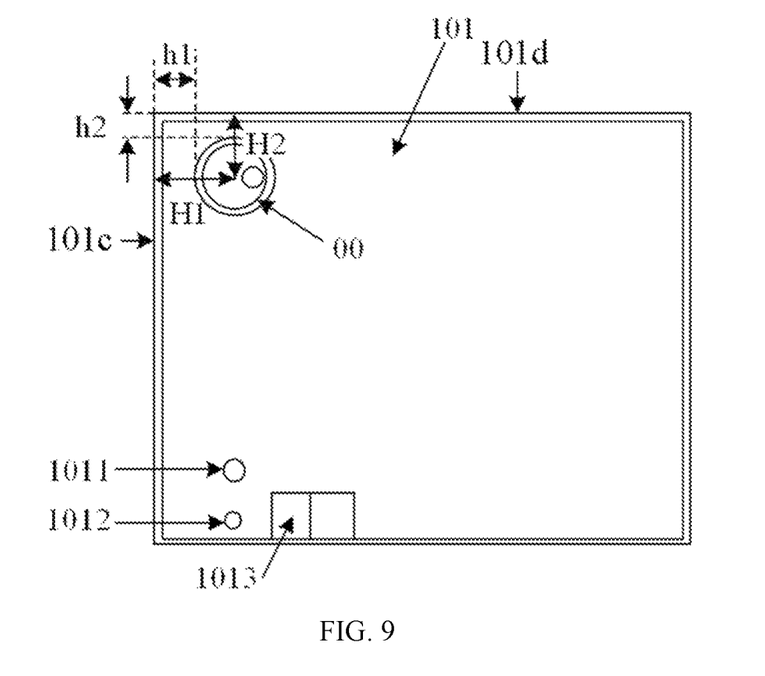
FIG. 9 is a top view of the display device shown in FIG. 8.

FIG. 8 is a schematic structural view of a display device according to an embodiment of the present disclosure. FIG. 9 is a top view of the display device shown in FIG. 8. For a display device with a size of the display screen ranging from 9 inches to 15 inches, it may be seen with reference to FIG. 9 that the distance H1 between the axis of the rotary knob cap 001 and a first side 101c of the rear case 101 may be 39.5 mm, and the distance H2 between the axis of the rotary knob cap 001 and a second side 101d of the rear case 101 may be 29.5 mm.

That is, the rotary knob cap 001 may be disposed near the edge of the outer surface of the rear case 101, thereby facilitating the user's hand operation and improving the user experience.

If the rotary knob cap body 0011 has a cylindrical structure and a diameter of 30 mm, the minimum distance h1 between the side of the rotary knob cap 001 and the first side 101c of the rear case 101 may be: h1=H1−30/2=24.5 mm, and the minimum distance h2 between the side of the rotary knob cap 001 and the second side 101d of the rear case 101 may be: h2=H2−30/2=14.5 mm.

The first side 101c and the second side 101d may be two sides of the rear case 101 that are perpendicular and adjacent to each other.

As may be seen with reference to FIGS. 8 and 9, a support hole 1011, a charging hole 1012, and a card slot 1013 may be further provided on the outer surface of the rear case 101. The support hole 1011 may be configured to connect with a support rod to support the display device. Exemplarily, the support hole 1011 may be a threaded hole, and the support rod may be threadedly connected to the support hole 1011. The charging hole 1012 may be configured to connect with a power supply. The card slot 1013 may be configured for providing a memory card (Trans-Flash Card, TF).

In summary, according to the embodiments of the present disclosure, there is provided a display device, which includes a rear case, a control circuit board, and a rotary knob assembly connected to the control circuit board. The rotary knob assembly may include a rotary knob cap and a rotary rod connected to the rotary knob cap. The rotary knob cap may be disposed on an outer surface of the rear case. Since the region outside the rear case of the display device is large, the size of the rotary knob cap disposed on the outside of the rear case may be designed to be large, it is not only beautiful, but also easy to operate, meeting ergonomic principles. In addition, the cost of switching images through the rotary knob assembly is lower but the flexibility of the switching is higher.

The above description only represents optional embodiments of the present disclosure but is not intended to limit the present disclosure. Any modification, equivalent replacement, or improvement made within the spirit and principle of the present disclosure shall fall within the scope of the present disclosure.

What is claimed is:

1. A display device, comprising:
a display panel;
a control circuit board connected to the display panel;
a rotary knob assembly connected to the control circuit board; and
a casing;
wherein the rotary knob assembly comprises a rotary rod and a rotary knob cap, the rotary rod is connected to the rotary knob cap, and the rotary knob cap is configured to drive the rotary rod to rotate,
wherein the rotary knob assembly is configured for generating a signal according to an action of the rotary knob cap and transmitting the signal to the control circuit board, and the control circuit board is configured for controlling the display panel to display according to the signal,
wherein the rotary knob assembly further comprises a switch encoder, the rotary rod is rotatably connected to the switch encoder, the switch encoder is further connected to the control circuit board, and the signal is generated by a movement of the rotary rod relative to the switch encoder,
wherein the rotary knob cap is disposed outside the casing, and a gap is provided between the rotary knob cap and the casing,
wherein the rotary knob cap comprises a rotary knob cap body and a connection sleeve, the rotary knob cap body comprises a cover plate and a baffle plate surrounding the cover plate, and the baffle plate is located at a side of the cover plate adjacent to the casing,
wherein the connection sleeve is disposed at the side of the cover plate adjacent to the casing, and one end of the rotary rod is disposed in the connection sleeve and fixedly connected to the connection sleeve, and
wherein the rotary knob cap further comprises a protrusion provided at a side of the cover plate adjacent to the casing and located in the connection sleeve, and a groove is provided in an end of the rotary rod, and the protrusion is seized in the groove of the rotary rod.

2. The display device according to claim 1, wherein the casing is a rear case of the display device, and the rear case is located at a side of the display device opposite to a display surface of the display panel.

3. The display device according to claim 1, wherein the rotary knob assembly further comprises an elastic connecting member configured to sleeve the rotary rod and located between the casing and the rotary knob cap; or
wherein the rotary knob assembly further comprises an elastic connecting member, the switch encoder comprises a groove, the elastic connecting member is disposed in the groove of the switch encoder, and one end of the rotary rod away from the rotary knob cap is disposed in the groove of the switch encoder, and the elastic connecting member is located between the rotary rod and an inner wall of the groove of the switch encoder.

4. The display device according to claim 1, wherein the rotary knob assembly further comprises a shielding sleeve;
wherein the shielding sleeve is disposed at the side of the cover plate adjacent to the casing, the connection sleeve is located in the shielding sleeve, one end of the shielding sleeve is configured to protrude from the baffle plate of the rotary knob cap body and distanced from the casing by a gap.

5. The display device according to claim 4, wherein:
the connection sleeve, the rotary rod and the rotary knob cap body are coaxial; and
the connection sleeve is in interference fit with the rotary rod.

6. The display device according to claim 4, wherein:
the shielding sleeve, the connection sleeve and the rotary knob cap body are of an integrated structure.

7. The display device according to claim 4, wherein:
the switch encoder and the control circuit board are both disposed in the casing; and
the casing is provided with a through hole, one end of the rotary rod is connected to the rotary knob cap, and the other end of the rotary rod is rotatably connected to the switch encoder through the through hole.

8. The display device according to claim 7, wherein:
an annular boss is provided outside the casing, the through hole is located in a region defined by the annular boss, and a gap is provided between the rotary knob cap and the annular boss.

9. The display device according to claim 8, wherein:
an outer diameter of the annular boss is equal to an outer diameter of an end of the rotary knob cap adjacent to the annular boss.

10. The display device according to claim 1, wherein:
a recess is provided in the cover plate of the rotary knob cap body at a side of the cover plate away from the casing and recessed in a direction from a surface of the cover plate to the casing, an axis of the recess of the cover plate is parallel to an axis of the rotary knob cap body, and is not collinear with the axis of the rotary knob cap body.

11. The display device according to claim 1, wherein:
the display device is an electronic picture frame.

12. The display device according to claim 1, wherein the switch encoder is provided with a plurality of stationary contacts distributed circumferentially with the rotary rod as an axis, and a movable contact is provided on the rotary rod.

13. The display device according to claim 8, wherein a length of a portion of the shielding sleeve protruding from the rotary knob cap body is greater than a distance between the baffle plate and the annular boss.

14. The display device according to claim 2, wherein a support hole, a charging hole, and a card slot are provided in the rear case, the support hole is configured to connect with a support rod to support the display device, the charging hole is configured to connect with a power supply, and the card slot is configured to receive a memory card.

15. The display device according to claim 1, wherein the rotary knob assembly is configured to perform a rotation operation for switching displayed pictures or videos and a pressing operation for locking the displayed pictures or videos.

16. The display device according to claim 1, wherein the switch encoder comprises a groove, a plurality of first stationary contacts and a plurality of second stationary contacts are provided in the groove of the switch encoder, the plurality of first stationary contacts are distributed circumferentially with the rotary rod as an axis, and the plurality of second stationary contacts are distributed circumferentially with the rotary rod as an axis,
a first movable contact and a second movable contact are provided on an end of the rotary rod located in the groove of the switch encoder, the first movable contact is configured to contact with the plurality of first stationary contacts rotatably, and the second movable contact is configured to contact with the plurality of second stationary contacts rotatably.

* * * * *